(12) United States Patent
Gao et al.

(10) Patent No.: US 11,023,018 B2
(45) Date of Patent: Jun. 1, 2021

(54) ELECTRONIC DEVICE AND SCREEN

(71) Applicant: BEIJING XIAOMI MOBILE SOFTWARE CO., LTD., Beijing (CN)

(72) Inventors: Jing Gao, Beijing (CN); Shaoxing Hu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/694,034

(22) Filed: Nov. 25, 2019

(65) Prior Publication Data
US 2020/0225713 A1 Jul. 16, 2020

(30) Foreign Application Priority Data
Jan. 16, 2019 (CN) .......................... 201910039764.4

(51) Int. Cl.
| | |
|---|---|
| *H05K 7/02* | (2006.01) |
| *H05K 7/04* | (2006.01) |
| *G06F 1/16* | (2006.01) |
| *G02B 6/42* | (2006.01) |
| *G02F 1/1333* | (2006.01) |

(Continued)

(52) U.S. Cl.
CPC ......... *G06F 1/1686* (2013.01); *G02B 6/4219* (2013.01); *G02B 6/4298* (2013.01); *G02F 1/133308* (2013.01); *G06F 1/1647* (2013.01); *G06F 1/1658* (2013.01); *H01L 25/105* (2013.01); *H04M 1/0264* (2013.01); *H04N 5/2257* (2013.01); *H05K 5/0017* (2013.01); *H05K 5/0021* (2013.01);

(Continued)

(58) Field of Classification Search
USPC .................................................. 361/809, 810
See application file for complete search history.

(56) References Cited

U.S. PATENT DOCUMENTS

| | | |
|---|---|---|
| 10,110,719 B2 | 10/2018 | Aberle |
| 2018/0176349 A1 | 6/2018 | Aberle |

(Continued)

FOREIGN PATENT DOCUMENTS

| | | |
|---|---|---|
| CN | 104900166 A | 9/2015 |
| CN | 108376019 A | 8/2018 |

(Continued)

OTHER PUBLICATIONS

Extended European Search Report issued in EP Application No. 19212173.9 dated Jan. 17, 2020, (5p).

*Primary Examiner* — Hung S. Bui
(74) *Attorney, Agent, or Firm* — Arch & Lake LLP

(57) ABSTRACT

The present disclosure provides an electronic device and a screen, and the electronic device includes a screen and a light acquiring component. The screen includes a main screen, an auxiliary screen and an optical fiber structure. The main screen comprises a light transmitting hole, and the auxiliary screen and the light acquiring component are disposed under the main screen, and alternately overlap the light transmitting hole. The optical fiber structure includes a first end surface adjacent to the auxiliary screen and a second end surface opposite to the first end surface. When the auxiliary screen overlaps the light transmitting hole, the optical fiber structure transmits an image on the auxiliary screen to the second end surface. The second end surface is flush with an imaging surface of the main screen.

19 Claims, 2 Drawing Sheets

(51) Int. Cl.
     *H04M 1/02*         (2006.01)
     *H04N 5/225*      (2006.01)
     *H05K 5/00*        (2006.01)
     *H05K 5/02*        (2006.01)
     *H01L 25/10*       (2006.01)

(52) U.S. Cl.
     CPC ....... *H05K 5/0217* (2013.01); *G02F 2201/02* (2013.01); *G06F 1/1626* (2013.01)

(56) References Cited

U.S. PATENT DOCUMENTS

2019/0208044 A1*   7/2019   Lee ..................... G06F 1/1684
2019/0243417 A1*   8/2019   Cheng ................ H04M 1/0264

FOREIGN PATENT DOCUMENTS

| CN | 108490718 | A | 9/2018 |
| CN | 207853958 | U | 9/2018 |
| CN | 108848213 | A | 11/2018 |

\* cited by examiner

ELECTRONIC DEVICE AND SCREEN

CROSS REFERENCE TO RELATED APPLICATIONS

This application claims priority to Chinese Patent Application No. 201910039764.4 entitled "ELECTRONIC DEVICE AND SCREEN COMPONENT" filed on Jan. 16, 2019, the entire content of which is incorporated herein by reference.

TECHNICAL FIELD

The present disclosure relates to an electronic device and a screen.

BACKGROUND

In the related art, an increase in a screen ratio of an electronic device such as a mobile phone can increase a display effect of a screen and overall user experience of the electronic device. However, a light acquiring component, such as a front camera, needs to cooperate with the screen to realize the corresponding front light acquiring function.

SUMMARY

The present disclosure provides an electronic device and a screen.

According to one aspect of the present disclosure, an electronic device is provided. The electronic device comprises: a light acquiring component and a screen. The screen comprises a main screen comprising a light transmitting hole; an auxiliary screen, wherein the auxiliary screen and the light acquiring component are disposed under the main screen, and alternately overlap the light transmitting hole; and an optical fiber structure comprising a first end surface adjacent to the auxiliary screen and a second end surface opposite to the first end surface, wherein the second end surface is flush with an imaging surface of the main screen.

According to a second aspect of the present disclosure, a screen is provided. The screen comprises: a main screen comprising a light transmitting hole; an auxiliary screen movably assembled under the main screen, wherein the auxiliary screen selectively moves away from or overlaps the light transmitting hole; and an optical fiber structure comprising a first end surface adjacent to the auxiliary screen and a second end surface opposite to the first end surface, wherein the second end surface is flush with an imaging surface of the main screen.

It is to be understood that the above general description and the following detailed description are merely illustrative and explanatory, and are not intended to limit the present disclosure.

BRIEF DESCRIPTION OF DRAWINGS

The accompanying drawings, which are incorporated into and constitute a part of the specification, illustrate examples consistent with the present disclosure and serve to explain the principles of the present disclosure together with the specification.

DETAILED DESCRIPTION

Figure 1:
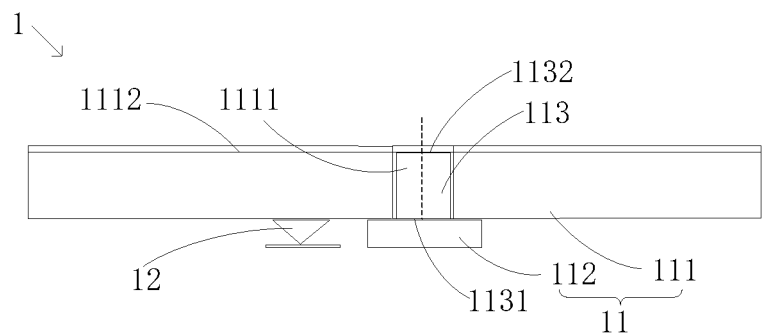
FIG. 1 is a schematic cross-section view of an electronic device according to an example of the present disclosure.

Examples will be described in detail herein with the examples thereof expressed in the drawings. When the following descriptions involve the drawings, like numerals in different drawings represent like or similar elements unless stated otherwise. The implementations described in the following examples do not represent all implementations consistent with the present disclosure. On the contrary, they are merely examples of an apparatus and a method consistent with some aspects of the present disclosure described in detail in the appended claims.

The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two functions or acts shown in succession may in fact be executed concurrently or may sometimes be executed in the reverse order, depending upon the functionality/acts involved.

For a full-screen electronic device, in order to increase the screen ratio and satisfy the front light acquiring function of a light acquiring component, a structure such as a blind hole that is matched with a front camera on the screen is provided in the related art, but the structure will occupy the display area of the screen of the electronic device, thereby reducing the display area and effect of the screen; while using a pop-up camera or the like will increase thickness and structural complexity of camera and electronic device.

It is to be noted that the light acquiring component may be one or more of a front camera, a light sensor, an auxiliary shooting component, etc., and the disclosure is not limited thereto. The specific structure of the electronic device will be described below with the front camera as an example.

Figure 2:
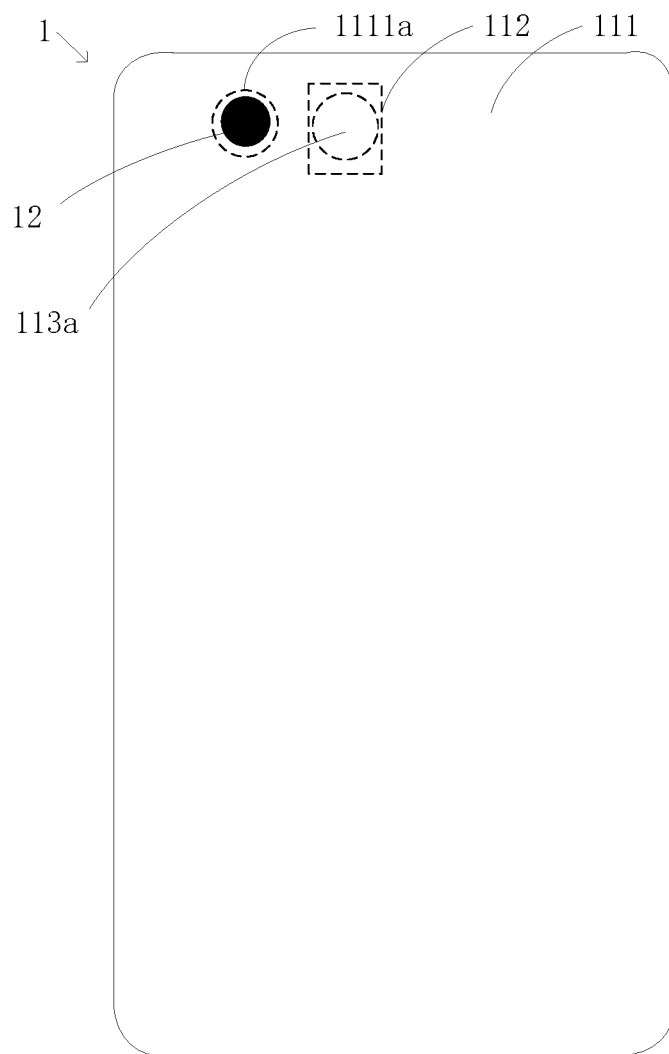
FIG. 2 is a schematic structural diagram of an electronic device when a front camera is in use according to another example of the present disclosure.
Figure 3:
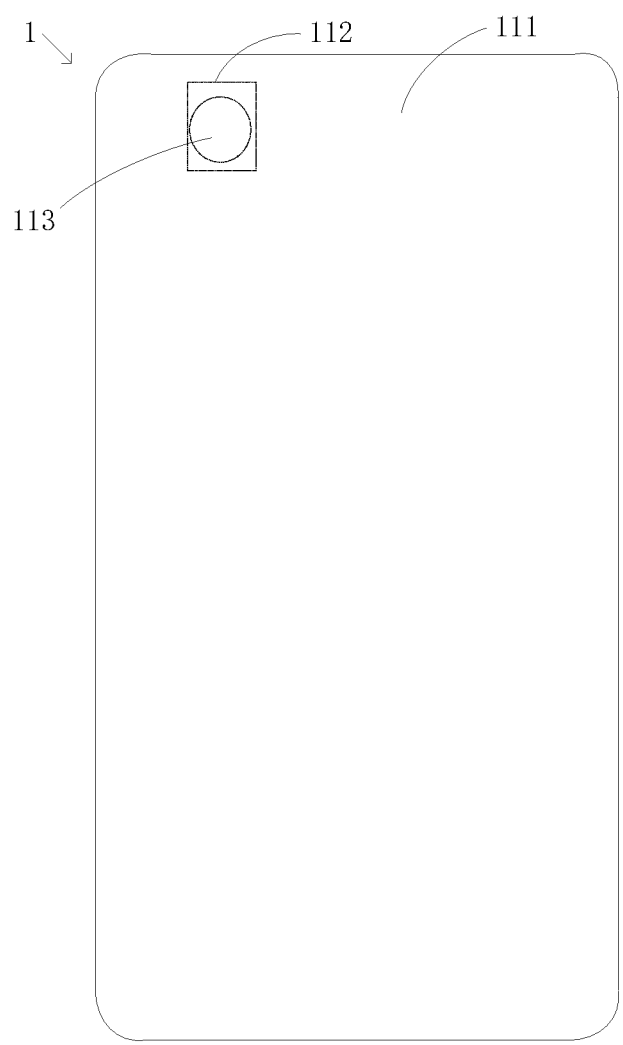
FIG. 3 is a schematic structural diagram of an electronic device when an auxiliary screen and a main screen are both in a display state according to another example of the present disclosure.

FIG. 1 is a schematic cross-section view of an electronic device according to an example of the present disclosure; FIG. 2 is a schematic structural view of an electronic device in a state in which a front camera is in use according to another example of the present disclosure; FIG. 3 is a schematic structural diagram of an electronic device when an auxiliary screen and a main screen are both in a display state according to another example of the present disclosure.

As shown in FIGS. 1-3, the electronic device 1 includes a screen 11 and a front camera 12. The screen 11 includes a main screen 111, an auxiliary screen 112, and an optical fiber structure 113. The main screen 111 is provided with a light transmitting hole 1111. The auxiliary screen 112 and the front camera 12 are disposed under the main screen 111, and alternately overlap the light transmitting hole 1111. The optical fiber structure 113 includes a first end surface 1131 adjacent to the auxiliary screen 112 and a second end surface 1132 opposite thereto. When the auxiliary screen 112 overlaps the light transmitting hole 1111, the optical fiber structure 113 transmits an image on the auxiliary screen 112 to the second end surface 1132 of the optical fiber structure 113, where the second end surface 1132 is flush with an imaging surface 1112 of the main screen.

In some examples, the optical fiber structure 113 includes an optical fiber. The optical fiber is a fiber made of glass, plastic and the like, which can transmit light and utilize the total reflection effect of light to reduce loss of light in a process of transmission from the first end surface 1131 to the second end surface 1132 of the optical fiber structure 113, thus enhancing transmission effect of the image on the auxiliary screen 112 and the joint imaging effect with the main screen 111.

The main screen 111 and the auxiliary screen 112 are provided for the screen 11 of the electronic device 1, and the auxiliary screen 112 and the front camera 12 are enabled to alternately overlap the light transmitting hole 1111 on the main screen 111 so that a photographing function is realized when the front camera 12 overlaps the light transmitting hole 1111, and a full screen display effect is realized together with the main screen 111 when the auxiliary screen 112 overlaps the light transmitting hole 1111. The above-mentioned structure is simple and easy to implement. The screen 11 may further include an optical fiber structure 113 that may contact and cooperate with the auxiliary screen 112. The optical fiber structure 113 can transmit the image displayed on the auxiliary screen 112 to the second end surface 1132 that is flush with the imaging surface 1112 of the main screen 111. Therefore, parallax generated when the main screen 111 and the auxiliary screen 112 are both in display state may be avoided, and thus the full screen display effect of the screen 11 is improved.

In some examples, the screen 11 may include at least one of an Organic Light-Emitting Diode (OLED) and a Liquid Crystal Display (LCD), which may be set according to specific structures and display requirements and are not limited herein. For example, an OLED may be selected for the auxiliary screen 112 of the screen 11 to enhance the color contrast and viewing angle of the auxiliary screen 112, thereby enhancing the joint display effect of the auxiliary screen 112 and the main screen 111. Alternatively, the main screen 111 of the screen 11 may also adopt an OLED to make the main screen 111 thin and light, and further reduce the parallax generated when the auxiliary screen 112 and the main screen 111 are both in display state.

In the examples above, the auxiliary screen 112 and the front camera 12 are disposed under the main screen 111, and can be moved in various manners, such as by a slide rail or a turntable, to alternately overlap the light transmitting hole 1111 on the main screen 111. Explanatory description will be made below with a slide rail as an example.

The electronic device 1 further includes a slide rail 13, and the auxiliary screen 112 and the front camera 12 are slidably assembled on the slide rail 13 so that the auxiliary screen 112 and the front camera 12 alternately overlap the light transmitting hole 1111 of the main screen 111 when the auxiliary screen 112 and the front camera 12 are driven to slide along the slide rail 13.

In some examples, the slide rail 13 includes a lateral rail 131 perpendicular to an axial direction of the light transmitting hole 1111, and the auxiliary screen 112 and the front camera 12 are slidably assembled on the lateral rail 131. The initial position of the auxiliary screen 112 may be set at a position of the lateral rail 131 corresponding to the position of the light transmitting hole 1111, and the optical fiber structure 113 contacts and cooperates with the auxiliary screen 112 to transmit the image on the auxiliary screen 112 to the second end surface 1132. The auxiliary screen 112 together with the main screen 111 implement a display effect of full screen without parallax. When the front camera 12 slides to overlap the light transmitting hole 1111, the auxiliary screen 112 leaves the initial position, and lens of the front camera 12 realizes light acquiring and shooting through the light transmitting hole 1111. After the front camera 12 completes the shooting, it returns to the previous position before slide movement along the lateral rail 131, and the auxiliary screen 112 is also moved to the initial position at the same time.

In the examples above, the optical fiber structure 113 may be fixedly disposed in the light transmitting hole 1111. When the front camera 12 is shooting, light is transmitted from the second end surface 1132 to the first end surface 1131 and then captured by the front camera 12. Loss of light in this process is small. The optical fiber structure 113 that does not move along with the auxiliary screen 112 not only reduces the overall thickness of the electronic device 1, but also reduces structural complexity of the electronic device 1. Alternatively, an optical fiber structure 113a may be slidably assembled on the lateral rail 131 outside a light transmitting hole 1111a and corresponds to the position of the auxiliary screen 112 to synchronously move with the auxiliary screen 112 so as to realize a corresponding imaging function. The optical fiber structure 113a disposed outside the light transmitting hole 1111a reduces the displacement of the auxiliary screen 112 during the movement, that is, the auxiliary screen 112 and the front camera 12 can respectively realize the full screen display effect and the shooting function by moving laterally, thereby improving the structural stability.

Figure 4:
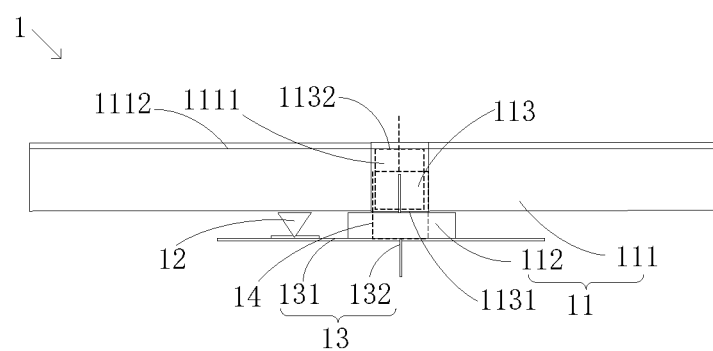
FIG. 4 is a schematic cross-section view of an electronic device in another example of the present disclosure.

As shown in FIG. 4, the slide rail 13 includes a longitudinal rail 132 parallel to the axial direction of the light transmitting hole 1111 and a lateral rail 131 perpendicular to the axial direction of the light transmitting hole 1111. The auxiliary screen 112 and the front camera 12 are slidably assembled on the lateral rail 131 or the longitudinal rail 132 to achieve displacement in both the axial and the radial direction of the light transmitting hole 1111. For example, the initial position of the auxiliary screen 112 may be set at a position of the lateral rail 131 corresponding to the position of the light transmitting hole 1111, and the optical fiber structure 113 is located in the light transmitting hole 1111. The optical fiber structure 113 contacts the auxiliary screen 112 and transmits the image on the auxiliary screen 112 to the second end surface 1132. At this time, the auxiliary screen 112 together with the main screen 111 realizes a display effect of full screen without parallax. When the front camera 12 is to be used, the optical fiber structure 113 is first moved out of the light transmitting hole 1111 along the longitudinal rail 132, then the optical fiber structure 113 and the auxiliary screen 112 are moved along the lateral rail 131 to leave the lateral initial position, and the front camera 12 slides to the light transmitting hole 1111 in this process. The lens of the front camera 12 realizes light acquiring and photographing through the light transmitting hole 1111. After the front camera 12 completes the shooting, it is moved along the lateral rail 131 to return to the position before slide movement, and the auxiliary screen 112 and the optical fiber structure 113 are also moved to the lateral and longitudinal initial positions.

In the example in which the optical fiber structure 113 moves synchronously with the auxiliary screen 112, the optical fiber structure 113 may be separately slidably assembled on the sliding rail 13, and moved corresponding to the position of the auxiliary screen 112 under control, thus improving the flexibility of movement and coordination of the optical fiber structure 113, the auxiliary screen 112 and the front camera 12. Additionally or alternatively, the screen 11 may further include a bracket 14 slidably connected with the slide rail 13, and the optical fiber structure 113 and the auxiliary screen 112 are assembled on the bracket 14 to move synchronously as a whole. The positional relationship between the optical fiber structure 113 and the auxiliary screen 112 assembled on the bracket 14 is fixed, thereby simplifying the steps of determining the imaging surface during the movement, which improves the operation convenience and structural stability.

In some examples, the light acquiring component includes two or more of the front camera 12, the light sensing sensor, and the auxiliary shooting component. A plurality of light acquiring components may be slidably assembled on the sliding rail 13 so that the respective light acquiring components overlap the light transmitting hole 1111 alternately by sliding to realize respective light acquiring functions. The above structural arrangement not only reduces the structural complexity of the electronic device 1, but also enhances the functional richness of the electronic device 1.

The light transmitting hole 1111 may be disposed in an edge region of the main screen 111 to reduce the influence on the display effect of the central region of the main screen 111, and reduce the influence of the joint display effect of the main screen 111 and the auxiliary screen 112 on the overall display effect. In some examples, the light transmitting hole 1111 may also be disposed in a central area of the main screen 111, so as to increase the installation space of the slide rail 13, the auxiliary screen 112, and the front camera 12, thereby reducing the installation difficulty.

The main screen 111 and the auxiliary screen 112 are provided for the screen 11 of the electronic device 1, and the auxiliary screen 112 and the front camera 12 are enabled to alternately overlap the light transmitting hole 1111 on the main screen 111 so that the photographing function is realized when the front camera 12 overlaps the light transmitting hole, and a full screen display effect is realized when the auxiliary screen 112 overlaps the light transmitting hole 1111. The above-mentioned structure is simple and easy to implement. The screen 11 may further include an optical fiber structure 113 that may contact the auxiliary screen 112. The optical fiber structure 113 may transmit the image displayed on the auxiliary screen 112 to the second end surface 1132 that is flush with the imaging surface 1112 of the main screen 111. Therefore, parallax generated when the main screen 111 and the auxiliary screen 112 are in display state is avoided, and the full screen display effect of the screen 11 is improved.

It is to be noted that the electronic device 1 may be a mobile phone, a tablet computer, etc., and the disclosure is not limited thereto.

The present disclosure further provides a screen 11 including a main screen 111, an auxiliary screen 112, and an optical fiber structure 113. The main screen 111 comprises a light transmitting hole 1111. The auxiliary screen 112 is movably assembled below the main screen 111 and may selectively move away from or overlap the light transmitting hole 1111. The optical fiber structure 113 includes a first end surface 1131 adjacent to the auxiliary screen 112 and a second end surface 1132 opposite thereto. When the auxiliary screen 112 overlaps the light transmitting hole 1111, the optical fiber structure 113 transmits the image on the auxiliary screen 112 to the second end surface 1132, and the second end surface 1132 is flush with the imaging surface 1112 of the main screen 111.

The optical fiber structure 113 may transmit the image displayed on the auxiliary screen 112 to the second end surface 1132 that is flush with the imaging surface 1112 of the main screen 111, thereby avoiding parallax generated when the main screen 111 and the auxiliary screen 112 are both in display state and improving full screen display effect of the screen 11.

In another example, the optical fiber structure 113 is fixedly assembled in the light transmitting hole 1111, and the optical fiber structure 113 that does not move along with the auxiliary screen 112 not only reduces the overall thickness of the electronic device 1, but also reduces the structural complexity of the electronic device 1.

In another example, the screen 11 may further include a bracket 14 on which the optical fiber structure 113 and the auxiliary screen 112 are assembled to move synchronously as a whole. The positional relationship between the optical fiber structure 113 and the auxiliary screen 112 assembled on the bracket 14 is fixed, thereby simplifying the steps of determining the imaging surface during movement and improving the operational convenience and structural stability.

In addition, other structural configurations of the screen 11 may be the same as the screen 11 mentioned in the foregoing electronic device example, and details are not described herein again.

In some examples, when the auxiliary screen overlaps the light transmitting hole, the optical fiber structure transmits an image on the auxiliary screen to the second end surface.

In some examples, when the light acquiring component overlaps the light transmitting hole, the light acquiring component acquires light through the light transmitting hole.

In some examples, the electronic device further comprises a slide rail, wherein the auxiliary screen and the light acquiring component are slidably assembled on the slide rail; and when the auxiliary screen and the light acquiring component slide along the slide rail, the auxiliary screen and the light acquiring component alternately overlap the light transmitting hole.

In some examples, the optical fiber structure is fixedly assembled in the light transmitting hole.

In some examples, the optical fiber structure is slidably assembled on the slide rail.

In some examples, the screen further comprises a bracket slidably connected with the slide rail, and the optical fiber structure and the auxiliary screen are assembled on the bracket to move synchronously.

In some examples, the slide rail comprises a longitudinal rail parallel to an axial direction of the light transmitting hole and a lateral rail perpendicular to the axial direction of the light transmitting hole.

In some examples, the light acquiring component comprises a front camera.

In some examples, the screen comprises a bracket, wherein the optical fiber structure and the auxiliary screen are assembled on the bracket to move synchronously.

After considering the specification and practicing the present disclosure, the persons of skill in the prior art may easily conceive of other implementations of the present disclosure. The present disclosure is intended to include any variations, uses and adaptive changes of the present disclosure. These variations, uses and adaptive changes follow the general principle of the present disclosure and include common knowledge or conventional technical means in the art not disclosed in the present disclosure. The specification and examples herein are intended to be illustrative only and the real scope and spirit of the present disclosure are indicated by the claims of the present disclosure.

It is to be understood that the present disclosure is not limited to the precise structures that have described and shown in the drawings, and various modifications and changes can be made without departing from the scope thereof. The scope of the disclosure is to be limited only by the appended claims.

What is claimed is:

1. An electronic device, comprising
a light acquiring component; and
a screen comprising:
   a main screen comprising a light transmitting hole;
   an auxiliary screen, wherein the auxiliary screen and the light acquiring component are disposed under the main screen, and alternately overlap the light transmitting hole;
   an optical fiber structure comprising a first end surface adjacent to the auxiliary screen and a second end surface opposite to the first end surface, wherein the second end surface is flush with an imaging surface of the main screen; and
   a slide rail, wherein the auxiliary screen and the light acquiring component are slidably assembled on the slide rail.

2. The electronic device according to claim 1, wherein when the auxiliary screen overlaps the light transmitting hole, the optical fiber structure transmits an image on the auxiliary screen to the second end surface.

3. The electronic device according to claim 1, wherein when the light acquiring component overlaps the light transmitting hole, the light acquiring component acquires light through the light transmitting hole.

4. The electronic device according to claim 1, wherein when the auxiliary screen and the light acquiring component slide along the slide rail, the auxiliary screen and the light acquiring component alternately overlap the light transmitting hole.

5. The electronic device according to claim 1, wherein the optical fiber structure is fixedly assembled in the light transmitting hole.

6. The electronic device according to claim 1, wherein the optical fiber structure is slidably assembled on the slide rail.

7. The electronic device according to claim 1, wherein the screen further comprises a bracket slidably connected with the slide rail, and the optical fiber structure and the auxiliary screen are assembled on the bracket to move synchronously.

8. The electronic device according to claim 1, wherein the slide rail comprises a longitudinal rail parallel to an axial direction of the light transmitting hole and a lateral rail perpendicular to the axial direction of the light transmitting hole.

9. The electronic device according to claim 1, wherein the light acquiring component comprises a front camera.

10. The electronic device according to claim 1, wherein the main screen is an Organic Light Emitting Diode (OLED) display screen or a Liquid Crystal Display (LCD) display screen.

11. The electronic device according to claim 1, wherein the auxiliary screen is an Organic Light Emitting Diode (OLED) display screen or a Liquid Crystal Display (LCD) display screen.

12. A screen, comprising:
a main screen comprising a light transmitting hole,
an auxiliary screen movably assembled under the main screen, wherein the auxiliary screen selectively moves away from or overlaps the light transmitting hole, and
an optical fiber structure comprising a first end surface adjacent to the auxiliary screen and a second end surface opposite to the first end surface, wherein the second end surface is flush with an imaging surface of the main screen,
a slide rail, wherein the auxiliary screen and a light acquiring component are slidable assembled on theslide rail such that the auxiliary screen and the light acquiring component alternately overlape the light transmitting hole.

13. The screen according to claim 12, wherein when the auxiliary screen overlaps the light transmitting hole, the optical fiber structure transmits an image on the auxiliary screen to the second end surface.

14. The screen according to claim 12, wherein when the light acquiring component overlaps the light transmitting hole, the light acquiring component acquires light through the light transmitting hole.

15. The screen according to claim 12, wherein the optical fiber structure is fixedly assembled in the light transmitting hole.

16. The screen according to claim 12, further comprising a bracket, wherein the optical fiber structure and the auxiliary screen are assembled on the bracket to move synchronously.

17. The screen according to claim 12, wherein the main screen is an Organic Light Emitting Diode (OLED) display screen or a Liquid Crystal Display (LCD) display screen.

18. The screen according to claim 12, wherein the auxiliary screen is an Organic Light Emitting Diode (OLED) display screen or a Liquid Crystal Display (LCD) display screen.

19. An electronic device, comprising
a light acquiring component; and
a screen comprising:
a main screen comprising a light transmitting hole,
an auxiliary screen movably assembled under the main screen, wherein the auxiliary screen selectively moves away from or overlaps the light transmitting hole, and
an optical fiber structure comprising a first end surface adjacent to the auxiliary screen and a second end surface opposite to the first end surface, wherein the second end surface is flush with an imaging surface of the main screen, and
a slide rail, wherein the auxiliary screen and the light acquiring component are slidable assembled on the slide rail such that the auxiliary screen and the light acquiring component alternately overlap the light transmitting hole.

* * * * *